United States Patent [19]  
Kosakowski

[11] 4,190,891  
[45] Feb. 26, 1980

[54] SYSTEM HAVING A FIXED EXCITATION AND PROVIDING A VARIABLE RATIO OUTPUT

[75] Inventor: Henry R. Kosakowski, Denville, N.J.

[73] Assignee: The Bendix Corporation, Teterboro, N.J.

[21] Appl. No.: 904,355

[22] Filed: May 9, 1978

[51] Int. Cl.² .................... G06J 1/00; G06G 7/16
[52] U.S. Cl. ............................ 364/606; 364/850
[58] Field of Search ............ 364/605, 606, 607, 842, 364/850

[56] References Cited

U.S. PATENT DOCUMENTS

| | | | |
|---|---|---|---|
| 3,177,350 | 4/1965 | Abbott et al. | 364/606 |
| 3,882,488 | 5/1975 | Kosakowski et al. | 364/605 |
| 4,076,424 | 2/1978 | Ida | 364/850 |

Primary Examiner—Felix D. Gruber  
Attorney, Agent, or Firm—Anthony F. Cuoca; William F. Thornton

[57] ABSTRACT

A system for providing a variable ratio output signal includes differential amplifier means for measuring the amplitude of a fixed reference signal relative to system ground. The measured signal is combined with a variable ratio command signal and a feedback signal to provide an output signal having a variable ratio amplitude relative to the fixed reference signal.

12 Claims, 3 Drawing Figures

SYSTEM HAVING A FIXED EXCITATION AND PROVIDING A VARIABLE RATIO OUTPUT

FIELD OF THE INVENTION

This invention relates to systems having a fixed excitation and providing a variable ratio output. More particularly, this invention relates to systems of the type described which simulate the variable ratio output provided by electro-mechanical devices having a fixed excitation.

DESCRIPTION OF THE PRIOR ART

Various electro-mechanical devices are excited by fixed voltages for providing variable ratio output voltages. Commonly used devices of this type are potentiometers wherein a variable ratio D.C. voltage is obtained by connecting a fixed D.C. excitation voltage across a resistance which is varied by a displaceable arm, or an autotransformer wherein a variable ratio A.C. voltage is obtained by connecting a fixed A.C. excitation voltage across the transformer windings and moving a contact over a portion of the windings.

These electro-mechanical devices are cumbersome and space consuming and do not readily lend themselves to utilization in, for example, airborne equipment or the like where solid state means are now commonly used to accomplish the various functions required. The system of the present invention provides the aforenoted solid state means for simulating the variable ratio output that has heretofore been provided by the aforenoted electro-mechanical devices.

SUMMARY OF THE INVENTION

This invention contemplates a system including a reference signal source and a differential amplifier for measuring the amplitude of the signal therefrom relative to system ground. The measured signal is multiplied by a variable ratio command signal to provide a signal at an amplitude which is at a commanded ratio relative to the amplitude of the reference signal from the reference signal source. The ratioed signal is applied to another differential amplifier to provide a feedback signal which is subtracted from the ratioed signal. The difference signal is integrated to provide a signal at an amplitude corresponding to the difference between the amplitude of reference signal from one side of the reference signal source and system ground. The integrated signal and the ratioed signal are added to provide an output signal at a variable ratio level relative to the reference signal amplitude. The arrangement is such that the output signal may be a D.C. signal, or, through appropriate multiplexing and converting, either a D.C. or an A.C. signal.

BRIEF DESCRIPTION OF THE DRAWINGS

FIG. 3 is a flow diagram indicative of the operation of the computer included in the invention as shown in FIGS. 1 and 2 for providing either an A.C. or D.C. output signal.

DESCRIPTION OF THE INVENTION

Figure 1:
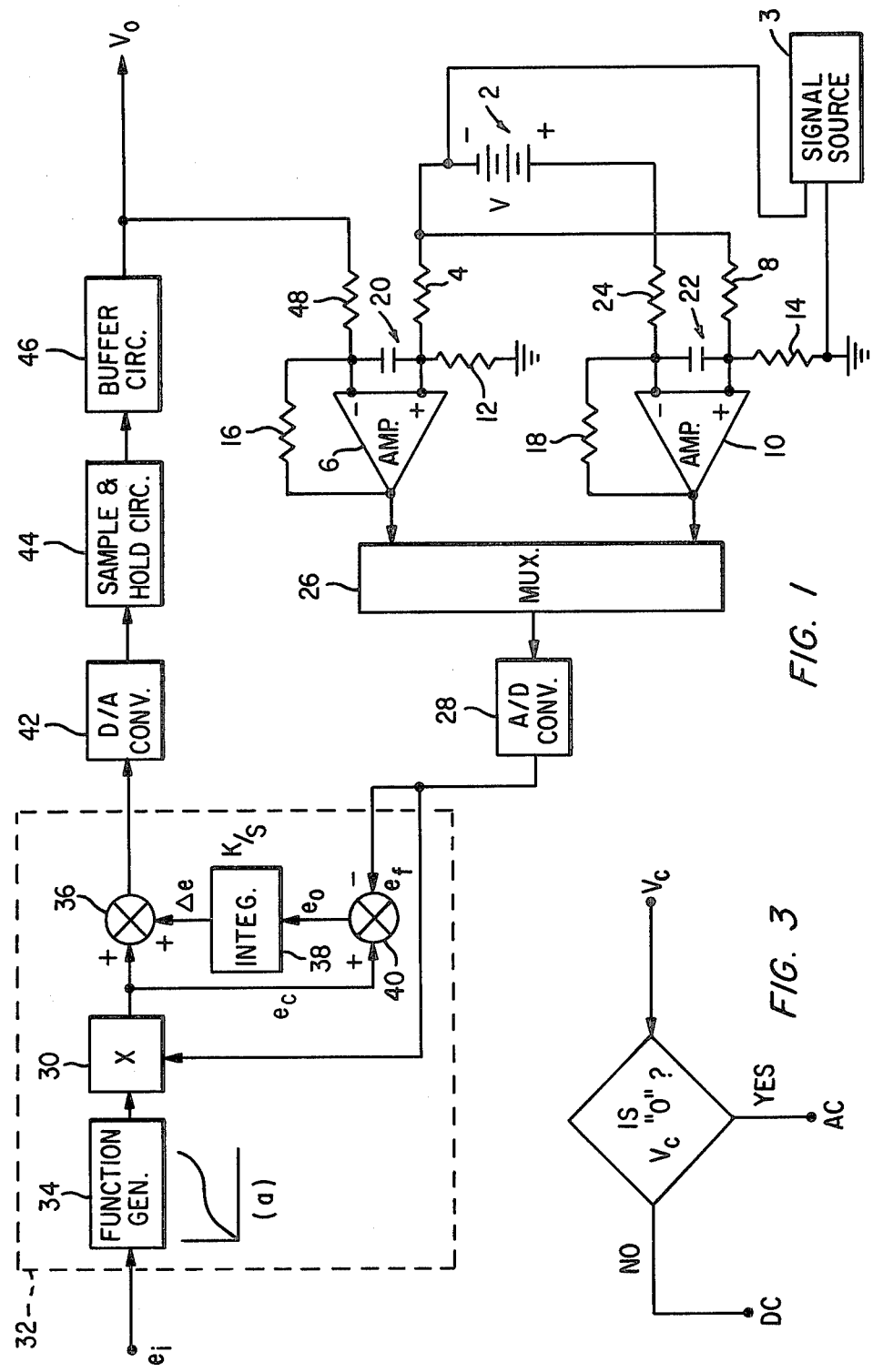
FIG. 1 is a combination block diagram-electrical schematic illustrating an embodiment of the invention wherein a variable ratio D.C. output signal is provided.

With reference first to FIG. 1, a signal source shown as a battery and designated by the numeral 2 provides a fixed D.C. reference signal V. The negative terminal of battery 2 is connected through a resistor 4 to a non-inverting input terminal (+) of a conventional type differential amplifier 6. The negative terminal is connected through a resistor 8 to the non-inverting input terminal (+) of a like differential amplifier 10 and is connected to a signal source 3 providing a voltage at an amplitude which is equal to the difference in potential between system ground and the negative (−) side of battery 2.

Amplifier 10 measures the amplitude of the reference signal from battery 2 relative to system ground as will be understood from the structural arrangement herein described.

The non-inverting input terminal (+) of amplifier 6 is connected to system ground through a resistor 12, and the non-inverting input terminal of amplifier 10 is connected to system ground through a resistor 14. Signal source 3 is connected to the grounded connection of non-inverting input terminal (+) of amplifier 10.

A resistor 16 is connected in feedback relation to the inverting input terminal (−) of amplifier 6 and to the output terminal thereof, and a feedback resistor 18 is connected to an inverting input terminal (−) of amplifier 10 and to the output terminal thereof.

A noise suppressing capacitor 20 is connected across the inverting and non-inverting input terminals of amplifier 16 and a like noise suppressing capacitor 22 is connected across the inverting and non-inverting input terminals of amplifier 18. The positive terminal of battery 2 is connected through a resistor 24 to the inverting input terminal (−) of amplifier 10.

The analog outputs from amplifiers 6 and 10 are applied through a multiplexer (MUX) 26 and therefore through an analog to digital (A/D) converter 28 which provides a digital signal. Multiplexer 26 is controlled by a digital computer 32 as hereinafter described with reference to FIG. 2.

The digital signal from analog to digital converter 28 is applied to a multiplier 30 included in a digital computer 32. Computer 32, in addition to multiplier 30, includes a function generator 34, adding means 36, integrating means 38 and subtracting means 40 and, in this sense, is similar to computers of the type well known in the art, such as described at Pages 338 to 342 to *Pulse Digital and Switching Waveforms,* Millman and Taub, McGraw Hill, 1965. A computer of this type is also used in conjunction with the invention disclosed and claimed in commonly assigned U.S. Pat. No. 3,827,047 issued to Henry Kasakowski, et al on July 30, 1974. The various functional relationships between the computer components will be hereinafter described.

An input signal $e_i$, which may be a signal from a flight condition sensor or the like such as used in aircraft navigational apparatus, is applied to function generator 34 in computer 32. Function generator 34 shapes the input signal to provide an appropriate digital variable ratio command signal as shown in (a) in the Figure. Multiplier 30 multiplies the digital variable ratio command signal by the signal from analog to digital converter 28 and provides a signal $e_c$ at a commanded variable ratio level relative to system ground.

The output from multiplier means 30 ($e_c$) is applied through adding means 36 to a digital to analog converter 42 and therefrom through a sample and hold circuit 44 to a buffer circuit 46.

The signal from buffer circuit 46 is applied through a resistor 48 to the inverting input terminal of amplifier 6 and returned to computer 32 via multiplexer 26 and analog to digital converter 28 as a feedback signal designated as $e_f$. The feedback signal and signal $e_c$ from multiplying means 30 are subtracted by subtracting means 40 to provide a signal $e_o$. Signal $e_o$ is integrated by integrating means 38 having an integrating factor K/S. Integrating means 38 provides a signal $\Delta e$ which is the equivalent of the difference in amplitude between the negative (−) side of battery 2 and system ground. Signal $\Delta e$ is added to signal $e_c$ from multiplier 30 by adding means 36 to provide, via digital to analog converter 42, sample and hold circuit 44 and buffer circuit 46, a D.C. output signal $V_O$ at the appropriate ratioed amplitude relative to reference signal V.

The device of the invention as described with reference to FIG. 1 provides a D.C. output signal $V_O$. As will now be understood, an A.C. output signal may be provided by substituting a suitable A.C. signal source for battery 2 or, indeed, either a D.C. or an A.C. signal may be provided as illustrated by the configuration of FIG. 2.

Figure 2:
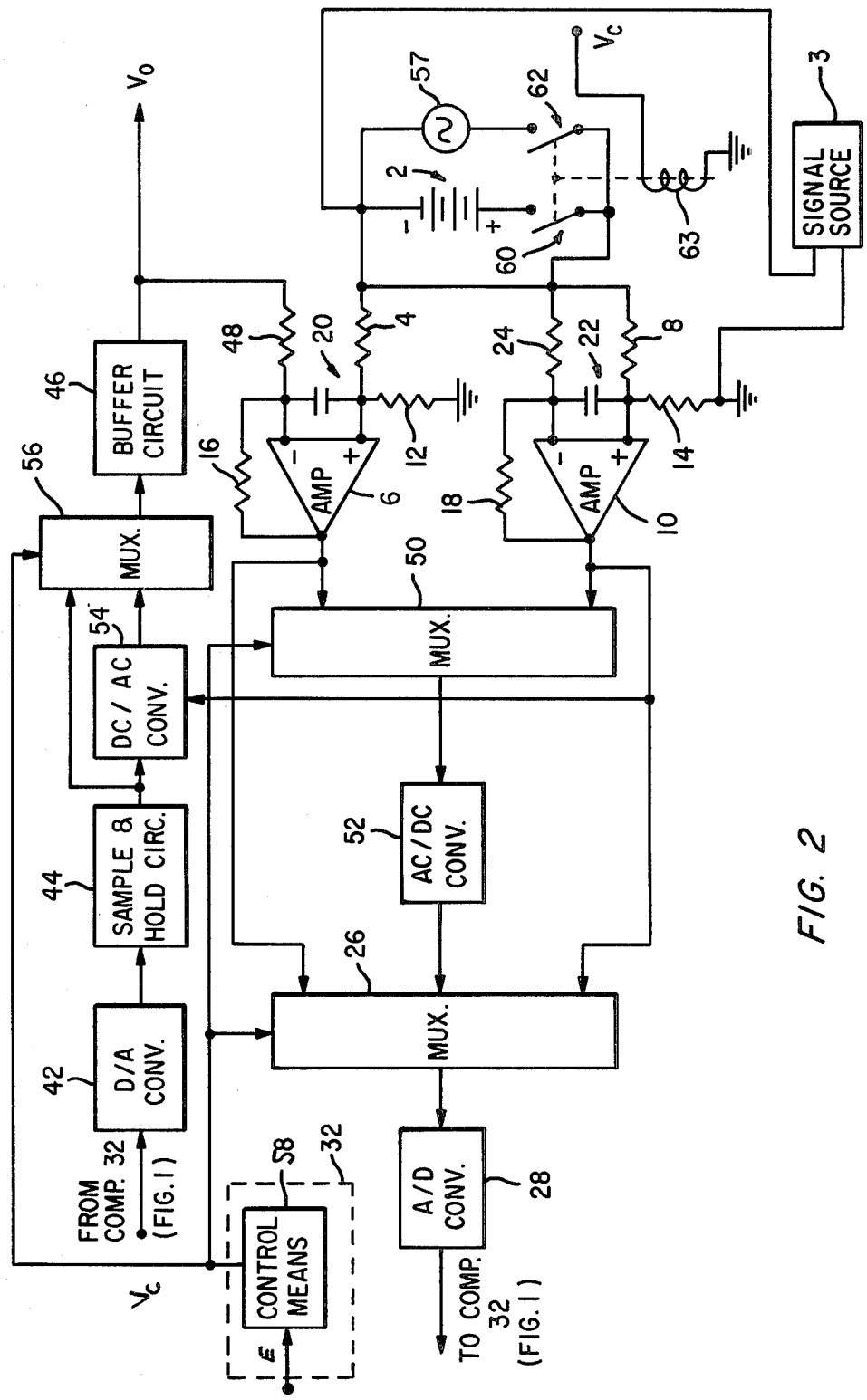
FIG. 2 is a combination block diagram-electrical schematic illustrating an embodiment of the invention wherein either an A.C. or a D.C. output signal is provided.

Thus, with reference to FIG. 2, a multiplexer 50 and an A.C. to D.C. converter 52 are included in the system of FIG. 1 intermediate amplifiers 6 and 10 and multiplexer 26, and an A.C. to D.C. converter 54 and a multiplexer 56 are included intermediate sample and hold circuit 44 and buffer circuit 46. Additionally, a voltage source 57 providing a fixed A.C. voltage is connected in parallel with battery 2. Battery 2 and A.C. source 57 are connected to amplifiers 6 and 10 through normally open switches 60 and 62, respectively, actuated by a relay 63 as is well known in the art. It is to be realized that switches 60 and 62 and relay 63 are shown by way of illustration and solid state switching devices may be used as well, in keeping within the spirit and scope of the invention.

The outputs from differential amplifiers 6 and 10 are applied to multiplexer 26 as described with reference to FIG. 1, and are applied to multiplexer 50 and therefrom to A.C. to D.C. converter 52, the output of which is applied to multiplexer 26. The D.C. output from sample and hold circuit 44 is applied directly to multiplexer 56 and is applied to the multiplexer via D.C. to A.C. converter 54.

In the form of the invention shown in FIG. 2, computer 32, in addition to including the components shown in FIG. 1, includes a control means 58 which provides a control signal for controlling multiplexers 26, 50 and 56. Control means 58 is operated by external means E which may be a switch or a computer keyboard arrangement or the like, as will be understood by those skilled in the art, to provide a command logic signal $V_C$ for commanding a D.C. or an A.C. output signal $V_O$, as the case may be. Signal $V_C$ closes switches 60 or 62 via relay 63 to connect battery 2 or alternating signal source 57 to amplifiers 6 and 10, depending upon whether a D.C. or an A.C. output $V_O$, respectively, is desired.

Control means 58 is responsive to external means E for providing control signal $V_C$ to control the appropriate multiplexers in accordance with the flow diagram shown in FIG. 3.

Thus, if signal $V_C$ is, for example, at a logic "0" level, control means 58 responds by providing an A.C. "YES" signal which is applied to multiplexers 26, 50 and 56. The multiplexers, in effect, act as switches controlled by the output from control means 58. In the case being described, wherein $V_C$ commands an A.C. output signal $V_O$, switch 62 is closed to include A.C. source 58 in the system and multiplexer 50 is affected to receive the resulting A.C. outputs from amplifiers 6 and 10, while multiplexer 26 is affected to pass the D.C. signal from converter 52 for conversion to a digital signal by converter 28 and subsequent processing by computer 32 as described with reference to FIG. 1. Likewise, multiplexer 56 is effected to pass the A.C. signal from converter 54, whereby A.C. output signal $V_O$ is provided. The A.C. output from amplifier 10 is applied to converter 54 to provide a reference for the A.C. to D.C. conversion performed thereby.

It will now be understood that if a D.C. output signal $V_O$ is commanded, battery 2 is connected to amplifiers 6 and 10 through the closing of switch 60 by signal $V_C$, multiplexer 50 and converter 52 are in a passive arrangement, i.e., inactive, as is converter 54 and multiplexer 56.

It will now be seen from the aforegoing description of the invention that a system has been described which has a fixed excitation and provides a variable ratio A.C. or D.C. output as the case may be. In this sense, the invention simulates the variable ratio output provided by the aforenoted electro-mechanical devices and may accomplish same by solid state means as is desirable in the art.

What is claimed is:

1. A system having a fixed excitation and providing a variable ratio output, comprising:

a signal source for providing a fixed reference signal;

first means connected to the signal source for measuring the amplitude of the reference signal relative to system ground;

means for providing a variable ratio command signal;

first combining means for combining the measured signal from the first means and the variable ratio command signal to provide a signal at a commanded variable ratio amplitude relative to the amplitude of the reference signal;

second means connected to the signal source and the first combining means and responsive to the signals therefrom for providing a feedback signal;

means for multiplexing the measured signal and the feedback signal and providing a multiplexed signal;

second combining means for combining the multiplexed signal and the signal at the commanded variable ratio amplitude relative to system ground; and means connected to the second combining means and responsive to the combined signal therefrom for providing an output signal at a variable ratio amplitude relative to the amplitude of the reference signal.

2. A system as described by claim 1, including:

the signal source for providing a fixed reference signal having a first terminal at which the reference signal is provided in one sense and a second terminal at which the reference signal is provided in an opposite sense; and another signal source connected to one of the first and second terminals and connected to system ground and providing a signal at an amplitude which equals the difference in potential between system ground and the one terminal.

3. A system as described by claim 2, wherein:
the second means includes a differential amplifier having a first input terminal connected to the signal source and receiving the signal therefrom in the opposite sense and connected to system ground, a second input terminal connected to the first combining means for receiving the signal therefrom; and an output terminal at which the feedback signal is provided.

4. A system as described by claim 1, wherein:
the first means includes a differential amplifier having a first input terminal connected to the signal source and receiving the signal therefrom in one sense, a second input terminal connected to the signal source for receiving the signal therefrom in an opposite sense and connected to system ground; and an output terminal at which the measured signal is provided.

5. A system as described by claim 4, wherein:
the first input terminal of the first means and the second input terminal of the second means are inverting input terminals; and the second input terminal of the first means and the first input terminal of the second means are non-inverting input terminals.

6. A system as described by claim 1, wherein:
the first combining means for combining the measured signal from the first means and the variable ratio command signal to provide a signal at a commanded variable ratio amplitude relative to system ground includes means for multiplying said signals.

7. A system as described by claim 1 wherein the second combining means for combining the feedback signal and the signal at the commanded variable ratio amplitude relative to system ground includes:
means for subtracting the commanded variable ratio amplitude signal and the feedback signal and providing a difference signal;
means for integrating the difference signal; and
means for adding the integrated signal and the commanded variable ratio amplitude signal.

8. A system as described by claim 7, including:
sample and hold means connected to the converting means; and
buffer means connected to the sample and hold means.

9. A system as described by claim 1 including:
the means for multiplexing the measured signal and the feedback signal providing an analog multiplexed signal;
means for converting the analog multiplexed signal to a digital signal;
the means for providing a variable ratio command signal providing a digital signal;
the first combining means providing a digital signal;
the second combining means providing a digital signal; and
the means connected to the second combining means and responsive to the combined signal therefrom for providing an output signal at a variable ratio amplitude relative to the amplitude of the reference signal includes means for converting the digital signal from the second combining means to an analog signal.

10. A system as described by claim 9, including:
the converting means connected to the first combining means for converting the digital signal therefrom to an analog signal;
the sample and hold means connected to the converting means; and
the buffer means connected to the sample and hold means and to the second means.

11. A system as described by claim 10, including:
means connected to the first and second means, to the first and second combining means and to the control signal means and affected by the control signal for rendering the first and second combining means responsive to the signal from the one signal source; and means connected to the means connected to the second combining means and responsive to the signal therefrom for providing an output signal at a variable ratio amplitude relative to the amplitude of the reference signal, and connected to the control signal means, and affected by the control signal for rendering said means connected to the second combining means responsive to the signal from the one signal source.

12. A system as described by claim 1, wherein:
the signal source providing a fixed reference signal includes a D.C. signal source and an A.C. signal source connected in parallel arrangement to one of the first and second means;
a first normally open switch is connected to the D.C. signal source and to the other of the first and second means;
a second normally open switch is connected to the A.C. signal source and to the other of the first and second means; and
the system includes means for providing a control signal for closing a predetermined one of the first and second switches to connect a corresponding one of the D.C. and A.C. signal sources to the other of the first and second means whereby both of the first and second means are connected to the one signal source.

* * * * *